United States Patent
Goss et al.

(10) Patent No.: US 8,645,773 B2
(45) Date of Patent: Feb. 4, 2014

(54) ESTIMATING TEMPORAL DEGRADATION OF NON-VOLATILE SOLID-STATE MEMORY

(75) Inventors: Ryan James Goss, Prior Lake, MN (US); David Scott Seekins, Shakopee, MN (US); Mark Allen Gaertner, Vadnais Heights, MN (US)

(73) Assignee: Seagate Technology LLC, Cupertino, CA (US)

( * ) Notice: Subject to any disclaimer, the term of this patent is extended or adjusted under 35 U.S.C. 154(b) by 386 days.

(21) Appl. No.: 13/173,962

(22) Filed: Jun. 30, 2011

(65) Prior Publication Data

US 2013/0007543 A1  Jan. 3, 2013

(51) Int. Cl.
*G11C 29/00* (2006.01)
*G06F 13/00* (2006.01)

(52) U.S. Cl.
USPC ............................ 714/718; 365/201; 711/106

(58) Field of Classification Search
USPC ............ 714/718, 721, 6.1, 6.11, 6.24, 25, 29, 714/48; 365/185.09, 185.29, 185.24, 201, 365/218, 226; 711/100, 106
See application file for complete search history.

(56) References Cited

U.S. PATENT DOCUMENTS

| | | | |
|---|---|---|---|
| 5,862,083 A * | 1/1999 | Tobita et al. | 365/185.09 |
| 2008/0181017 A1 | 7/2008 | Watanabe et al. | |
| 2010/0262792 A1 | 10/2010 | Hetzler et al. | |
| 2010/0262875 A1 | 10/2010 | Hetzler et al. | |
| 2012/0254555 A1 * | 10/2012 | Miwa et al. | 711/154 |
| 2013/0148437 A1 * | 6/2013 | Bronner et al. | 365/185.29 |

* cited by examiner

*Primary Examiner* — Christine Tu
(74) *Attorney, Agent, or Firm* — Hillingsworth Davis, LLC

(57) ABSTRACT

Representative locations of a non-volatile, solid-state memory of an apparatus store characterization data. An event during which elapsed time is not measured by the apparatus is determined. In response to the event, temporal degradation of the non-volatile, solid-state memory during the event is estimated based on electrical characteristics of the representative locations.

20 Claims, 5 Drawing Sheets

ESTIMATING TEMPORAL DEGRADATION OF NON-VOLATILE SOLID-STATE MEMORY

SUMMARY

The present disclosure is related to systems and methods for estimating temporal degradation of non-volatile solid-state memory. For example, in one embodiment, a method involves identifying representative locations of a non-volatile, solid-state memory of an apparatus that store characterization data. An event is detected, during which elapsed time is not measured by the apparatus. In response to the event, temporal degradation of the non-volatile, solid-state memory during the event is estimated based on electrical characteristics of the representative locations.

In another embodiment, an apparatus includes a controller capable of being coupled to a non-volatile, solid-state memory. The controller is configured to identify representative locations of the non-volatile, solid-state memory and detect an event during which elapsed time is not measured by the apparatus. In response to the event, the controller is configured to estimate temporal degradation of the non-volatile, solid-state memory during the event based on electrical characteristics of the representative locations.

In another embodiment, an apparatus includes a controller capable of being coupled to a non-volatile, solid-state memory. The controller is configured to detect an event during which elapsed time is not measured by the apparatus. In response to the event, the controller is configured to recover characterization data at representative locations of the non-volatile, solid-state memory to determine electrical characteristics of the representative locations, and estimate temporal degradation of the non-volatile, solid-state memory during the event based on the electrical characteristics.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

Figure 1A:
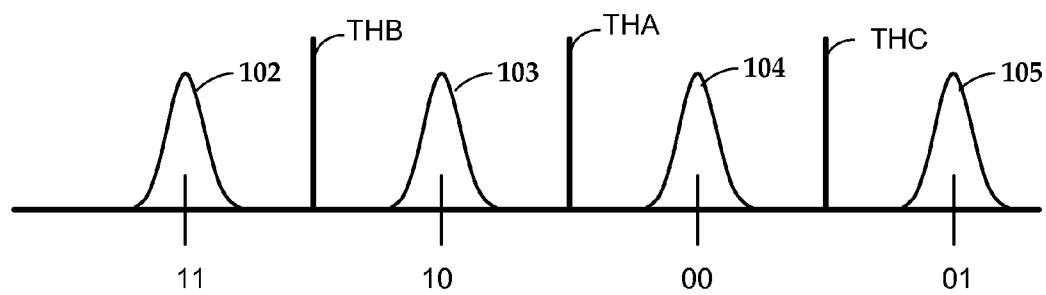
FIGS. 1A-1C are graphs illustrating the effects of data retention charge loss for non-volatile, solid state memory cells according to example embodiments.

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the present invention.

The present disclosure is generally related to systems and methods that facilitate dealing with temporal degradation of data storage media. For example, solid-state, non-volatile memory is known to exhibit degradation over time. In order to ensure efficient operation, a controller of such a memory device may need to determine elapsed time (e.g., elapsed time since a particular block of memory was last programmed) into account when performing certain operations such as error correction, data recovery, garbage collection, etc. This may be of particular interest if the device has been powered off for a long time (e.g., weeks or months).

There may be situations where it is difficult to determine elapsed time. For example, unlike a personal computer, a memory storage device may not include a battery and clock to keep track of time when powered off. While the host system may be able to inform the device of the current time, not all host systems can or do provide this information. Further, host systems can be misconfigured or exhibit errors that cause the system clock to be incorrect. As a result, a solid-state, non-volatile memory storage device may require an independent way to determine elapsed time, or at least some other measure that can be used to estimate temporal degradation of the memory (e.g., data retention).

In the discussion that follows, the data storage media may be described as being solid-state, non-volatile memory, such as flash memory. Flash memory is known to have a limit on the number of program/erase (OE) cycles that the memory cells can undergo before being worn out, e.g., when the cells can no longer reliably store data. It has also been found a sustained period of write activity (e.g., high data transfer rates for storage to the media) can accelerate this degradation of the media, in which case it may be desirable to reduce data transfer rate during writes.

Flash memory, e.g., NAND or NOR flash memory, includes cells similar to a metal-oxide semiconductor (MOS) field-effect transistor (FET), e.g., having a gate (control gate), a drain, and a source. The drain and the source are connected by a channel. In addition, the cell includes what is known as a "floating gate." When a selected voltage is applied to the control gate, differing values of current may flow through the channel depending on the value of the threshold voltage. This current flow can be used to characterize two or more states of the cell that represent data stored in the cell.

In single-level cell (SLC) memory, two voltage levels are used to characterize a state of each cell, allowing SLC memory to store one bit of information per cell. In multi-level cell flash (MLC) memory, more than two voltage levels are used to characterize a state of each cell, thus allowing MLC flash memory to store more than one bit per cell. Because of this, MLC flash memory is less expensive than SLC on a per-byte basis. However, MLC flash memory often suffers more from degradation/wear due to repeated use than does SLC flash memory, and may also suffer more from data retention errors due to the passage of time.

Figure 1B:
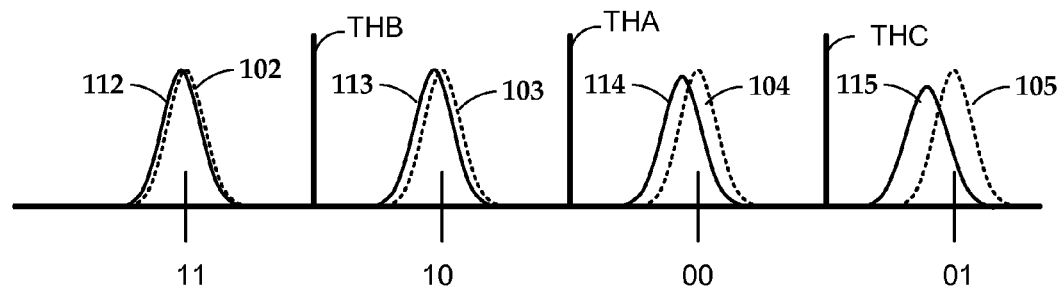
Figure 1C:
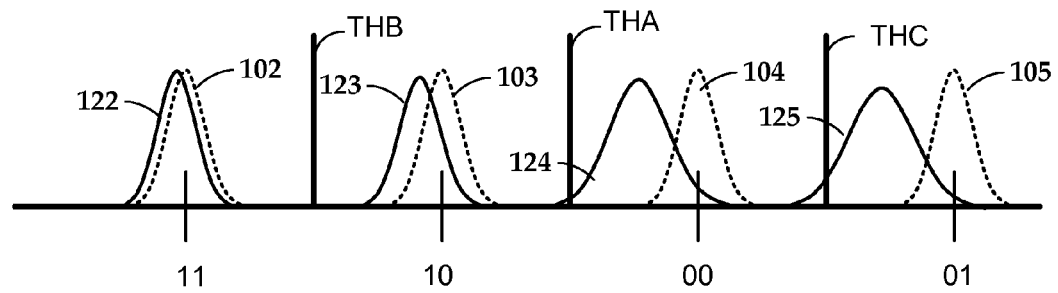

In reference now to FIGS. 1A-1C, a series of diagrams illustrates data retention characteristics of a solid-state, non-volatile memory device according to an example embodiment. The these diagrams illustrates voltage distributions for an MLC memory array capable of storing two bits per memory cell according to an example embodiment. Generally, when a flash cell is read, a voltage intermediate between the voltages THB, THA, and THC is applied to the control gate of the cell. The MOSFET channel will become conducting or remain insulating, depending on the applied voltage, which is in turn controlled by charge on the floating gate. This threshold voltage, or read voltage, determines what data is currently stored in the cell.

In the example of FIG. 1A, the digital symbol "11" corresponds to the lowest read voltage distribution 102, and may represent the erased state. Voltage distribution 103 is associated with digital symbol "10", voltage distribution 104 is associated with the digital symbol "00", and voltage distribution 105 is associated with the digital symbol "01". For each digital symbol, the digit on the left is the most significant bit (MSB) and the digit on the right is the least significant bit (LSB). It will be appreciated that the illustrated MLC voltage distributions in FIG. 1A are provided for purposes of illustration, and not limitation. The concepts described herein may be equally applicable to other types of non-volatile, solid-state memory cells, including those with fewer or greater bits of data per cell.

In order to write/program a solid-state memory cell (assuming that the cell is in a state ready for programming, e.g., erased), controller circuitry applies a voltage to the control gate of the cells until the floating gate is charged to the desired threshold voltage associated with the data being written. The distributions 102-105 represent a state of a population of memory cells after having just been programmed with respective data symbols. As with any real-world system, there may be some variance in the actual threshold voltage from cell to cell, but after programming (assuming cells are not worn or defective) the distributions should be within the expected ranges.

In FIG. 1B, distributions 112-115 represent a change in the original detected cell threshold voltages after passage of time (e.g., two weeks). The original distributions 102-105 are shown in dashed lines for purposes of comparison. Through what is known as "detrapping," or charge leakage, the detected threshold voltages exhibit some drift, both in average and width (e.g., standard deviation) of the distributions. This may be particularly true for the rightmost distributions 114, 115, which represent a greater charge difference from the erased state (distribution 102) than for distributions 112 and 113. After an even longer period of time (e.g., three months), the voltages may drift even further as shown by distributions 122-125 in FIG. 1C. These effects may become even more pronounced as the cells become worn, e.g., subjected to some number of program-erase cycles. These effects are may also be dependent on temperature, e.g., high temperatures can accelerate the shifts significantly.

The data retention effects illustrated in FIG. 1A-C are not unexpected, and a data storage device can compensate as long as a reasonable estimate can be made of elapsed time since a particular cell or group of cells was last programmed. This estimate may become more important the longer the duration for which time measurements are not kept (e.g., power-off time), and even more so as the memory cells become more worn. However, as described above, this measure of absolute time may not always be available.

Accordingly, the present disclosure relates to methods, systems, and devices that facilitate determining the amount of time since a block of memory has been programmed in a storage device. This generally involves characterizing the data degradation at particular cells of the memory to estimate the amount of signal loss the storage media has suffered. The more loss of signal, the longer the time since the media has been programmed. The degradation is temporal, e.g., based at least on time, although other factors such as temperature and current state of wear may also contribute to the degradation. It will be understood that the term "temporal degradation" as used herein may refer to a measure of charge loss that is based on time and one or more other factors such as temperature. The temporal degradation may be expressed as units of time, although corrected for other factors. For example, an elapsed time of one hour at 120 degrees F. could be normalized to a corrected elapsed time of 1+x hours at 70 degrees F. It will be understood that in the discussion that follows, measures of time as related to power-on tracking of metrics may also include measuring/deriving corrected times that take factors such as temperature and wear into account.

Figure 2:
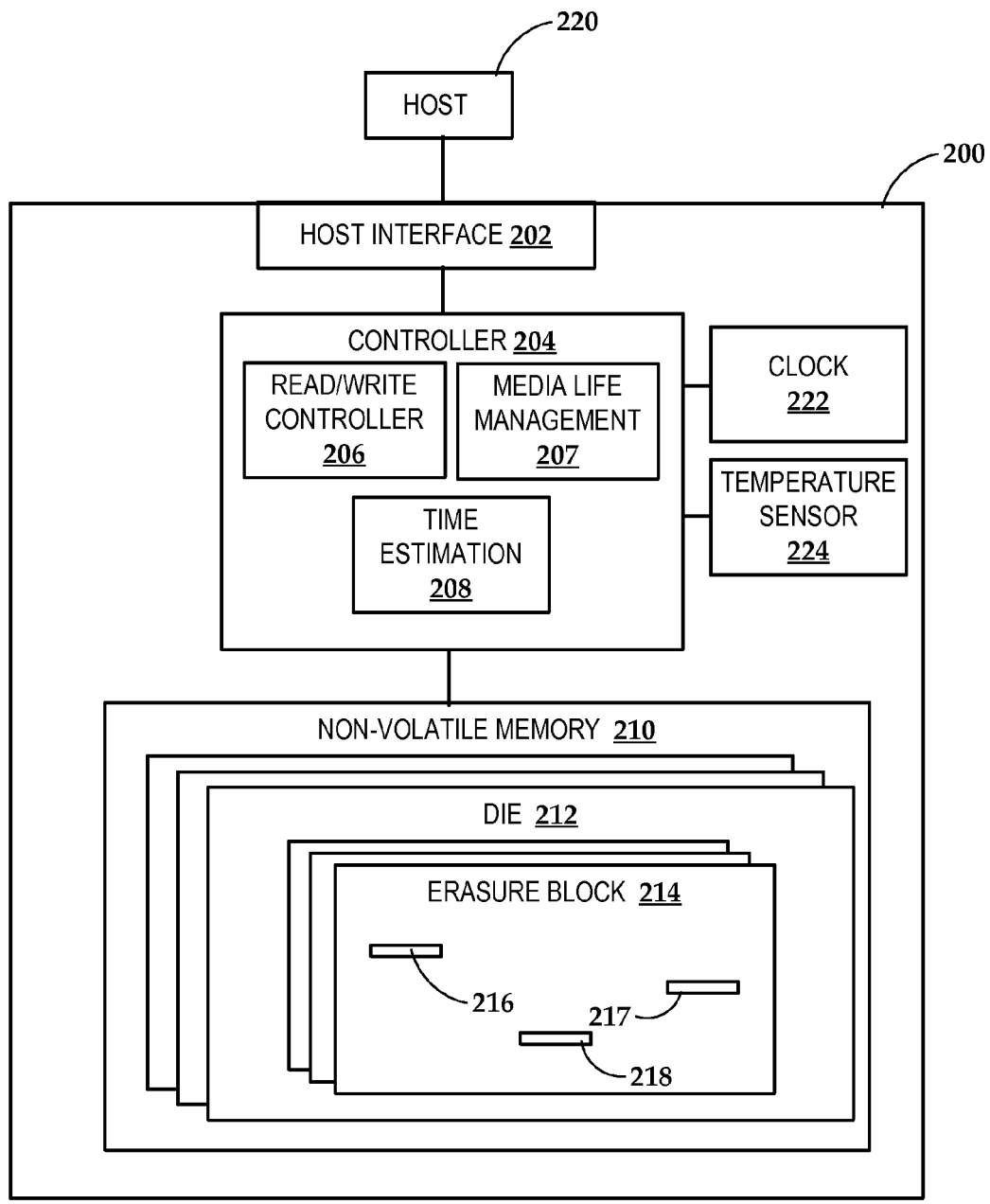
FIG. 2 is a block diagram illustrating an apparatus according to an example embodiment.

In the embodiments described herein, read errors can be corrected based on a comparison between a time stamp that a cell was programmed and an adjusted elapsed time. The adjusted elapsed time may include both power-on time measurements (corrected or uncorrected based on temperature, wear, etc.), and the estimate of temporal degradation. In FIG. 2, a block diagram illustrates an apparatus 200 according to an example embodiment. The apparatus 200 may be any type of persistent solid-state storage device, including a solid-state drive (SSD), thumb drive, memory card, embedded device storage, etc. The apparatus 200 may include a host interface 202 facilitates communications between the apparatus 200 and the host system 220, e.g., a computer. The apparatus 200 also includes media, here shown as solid-state, non-volatile memory 210. A host 220 can store data on the memory 210 and read data from the memory 210 via the host interface 202, which hides the operation of internal components of the apparatus 200 from the host 220.

The non-volatile memory 210 includes the circuitry and media used to persistently store both user data and other data managed internally by apparatus 200. The non-volatile memory 210 may include one or more flash dies 212, which individually contain a portion of the total storage capacity of the apparatus 200. The memory contained within individual dies 212 may be further partitioned into blocks, here annotated as erasure blocks/units 214. The erasure blocks 214 represent the smallest individually erasable portions of memory 210. The erasure blocks 214 in turn include a number of pages (not shown) that represent the smallest portion of data that can be individually programmed or read. In a NAND configuration, for example, the page sizes may range from 512 bytes to 4 kilobytes (KB), and the erasure block sizes may range from 16 KB to 512 KB. It will be appreciated that the present embodiments described herein are not limited to any particular size of the pages and blocks 214, and may be equally applicable to smaller or larger data unit sizes.

The apparatus 200 includes one or more controllers 204, which may include general- or special-purpose processors that perform operations of the apparatus. The controller 204 may include any combination of microprocessors, digital signal processor (DSPs), application specific integrated circuits (ASICs), field programmable gate arrays (FPGAs), or other equivalent integrated or discrete logic circuitry suitable for performing the various functions described herein.

Functions that may be provided by the controller 204 include read/write operations, media life management, and write throttling, which are represented here respectively by functional modules 206-208. The modules 206-208 may be implemented using any combination of hardware, software, and firmware, and may cooperatively perform functions related to error correction as described herein. Read/write module 206 performs operations related to mediating data storage operations between host interface 202 and media 210. These operations may include, addressing, selecting, buffering, verifying, decoding and/or translating of data.

A media life management module 207 monitors read/write operations and other factors related to wear and condition of the memory. The module 207 may create and update statistics/metrics related to these operations, such as tracking program-erase cycles, time of operation, etc. The statistics may be used for operations such as garbage collection, wear leveling, error correction, etc. For example, the module 207 may use an onboard clock 222 to record time stamps for various operations, such programming various block 214 and/or sub-units thereof. The time stamps may be used for purposes of error correction, e.g., to compensate for the effects of data retention losses. Other sensor data may be recorded with the time stamps, such as a temperature sensor 224.

Using time stamps, the module 208 can perform runtime measurements used for determining retention time of the storage media 210. Time stamps can be separately measured for any logical of physical division of the memory 210. For purposes of the present discussion, time measurements are described as being tracked at the erasure block level 214, although this is not intended to be limiting. The module 208 can also make estimates of elapsed time for periods when there is no time reference available, e.g., power-off times. These estimates are made by utilizing patterns 216-218 stored in various locations within memory 210.

The patterns 216-218 can be used as a reference point of known data in the storage device 200. The patterns 216-218 can be written at specific locations throughout the storage media 210 in order to give representative sampling of the entire physical storage media. The patterns 216-218 can be stored in random location(s) so as to create a statistically significant sampling of the media, and/or there may be pre-determined locations which exhibit distinct characterization information, such as the last word line of a block, may have shorter retention time than other word lines below.

In one example, the signature patterns 216-218 can be a predefined signature pattern, such as a series of data symbols that experience the highest levels of charge loss (e.g., symbols "00" and "01" in FIGS. 1A-C). In another case, the patterns 216-218 may be user data. In the latter case, the patterns 216-218 may be associated with extra error correction codes (e.g., more extensive than used elsewhere in the memory 210) to ensure the data can be recovered even in the extent of significant degradation. In either case, if the patterns 216-218 allow a comparison between nominal programmed threshold voltages and current threshold voltages, differences between those voltages can be attributed at least to the passage of time.

Figure 3:
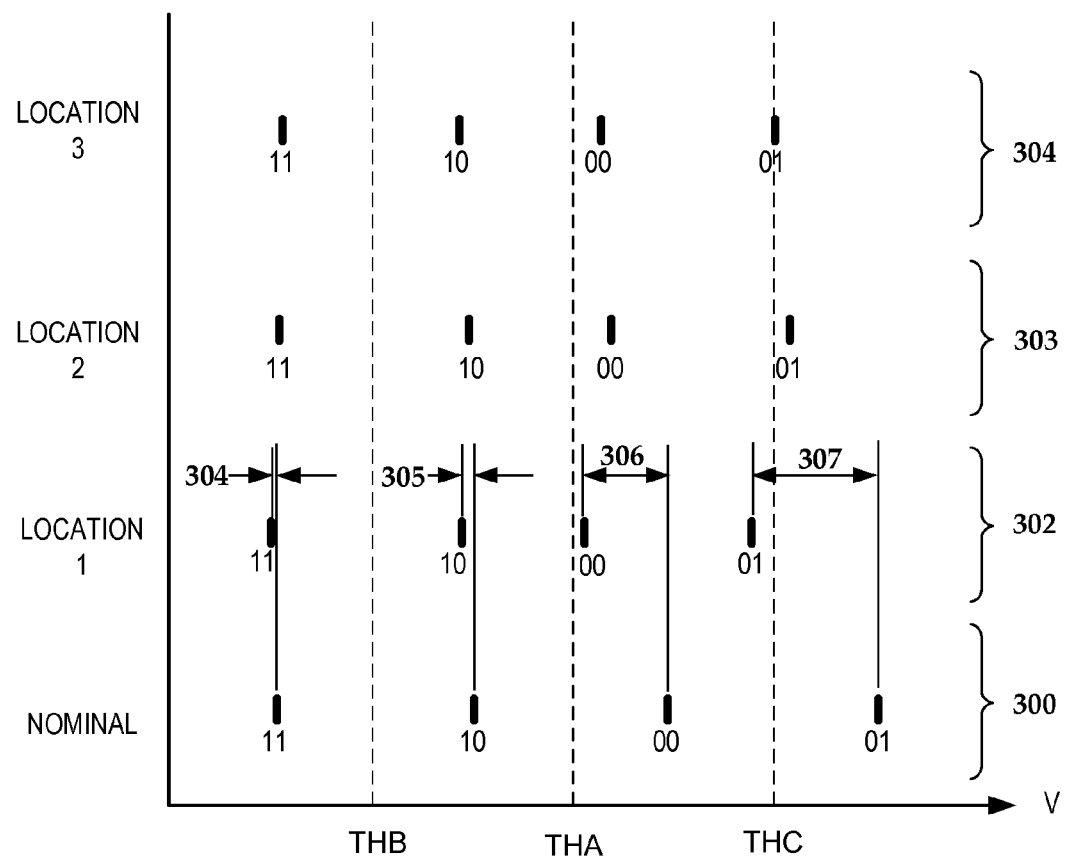
FIG. 3 is a graph comparing threshold voltage shifts due to data retention charge loss at multiple locations according to an example embodiment.

An example of threshold voltage differences due to temporal degradation is shown in the graph of FIG. 3. This graph shows temporally degraded threshold voltages (the horizontal axis) for three memory locations 302-304 storing known and/or recoverable patterns. The locations 302-304 may be preselected or randomly chosen. For purposes of this example, it is assumed that each of the locations 302-304 was programmed at the same time, and a two-bit per cell MLC memory is assumed. This example also assumes all four symbols are stored/analyzed in the locations 302-304, although the concepts can be equally applied to use of fewer symbol patterns (or more patterns, e.g., MLC memory with more than four states). The locations 302-304 (e.g., individual pages) may contain a large number of respective symbols, and so the voltage values shown for the symbols may be a composite (e.g., average) of all the memory cells storing the respective symbols. Other statistical data such as standard deviation may also be applicable to the illustrated voltage values.

Also seen in FIG. 3 are reference voltages 300, which may correspond to measured or theoretical nominal voltages for each of the respective symbols. In one arrangement, the reference voltages 300 may be specific to each location 302-304, e.g., having been measured and recorded when the patterns are first programmed or at some other time. Alternatively, the reference voltages 300 may be the nominal voltages specified by the device manufacturer and/or determined at the time of manufacture.

Due to the passage of time, locations 302-304 exhibit a voltage shift compared to the nominal values 200. As indicated by reference numerals 304-307 for location 302, a different amount of voltage shift may be seen for each of the various symbols. The time duration over which these shifts occurred may not be all accounted for. Some of the time may be tracked by the device (e.g., using an internal clock) during runtime. However, the device may have had power removed for some other, indeterminate, period of time. If the indeterminate period of time is significant (e.g., weeks, months), then the device may have to deal with a large number of bit errors. An estimate of the indeterminate period of time may be useful in recovering from those errors.

Some of the voltage shifts, such as 306, 307, may be selected for analysis due to their relatively large magnitude. This analysis may use a combination of both measured time (and temperature) along with analysis of the shift values 306, 307 themselves. For example, during the time when these shifts 304-307 occurred, the device may have logged 800 hours of run time, and also experienced two unpowered events of unknown duration. If the expected amount of shift 307 for symbol "01" is commensurate with data retention of 3,000 hours, it may be assumed that the power off events totaled 2200 hours (approximately 3 months). This assumption may be verified, e.g., by finding a significant number of other equivalent pattern locations that experience a similar shift, by analyzing shift 306 using similar criteria, etc.

Locations 303, 304 in FIG. 3 show less of a shift than location 302 even though, as noted above, they were all programmed at the same time. This could be due to statistical variation, although there are other variations that could account for these differences. For example, each of locations 302-304 could be on different word lines. In a NAND flash memory device, each symbol of a respective page is stored in FET memory cell that is in series with other cells in the memory block, the series of FETs running from ground to a bit line. Higher pages are associated with word lines that are farther from ground along the series, and the cumulative effect of FETs between ground and the target page may increase temporal charge loss for higher number pages. If the relative amount of voltage drift is found to correlate strongly to page order, then a sliding time correction factor could be used. This time correction could scale prediction of temporal degradation (and also scales factors used to correct the degradation) with relative order along the word line.

In other arrangements, variations between locations 302-304 may be due to each residing in a different erasure block, memory die, or some other physical or logical division/block. This can be verified, e.g., by finding stored patterns within the same divisions/blocks that validate the respective results 302-304. In such a case, predictions of temporal degradation could be tailored on a per-block basis. The characterization (e.g., forming a look-up table, correlation function) of sample memory cell patterns based on block location may be performed during manufacture and/or testing so that patterns in each erasure block could have corrective factors applied to account for block-to-block differences.

The corrective factors described above may be continually updated through the lifetime of the device. For example, as erasure blocks are selected for garbage collection and the amount of power-on time is known, the signal loss can be measured and the look-up table or correlation function can be adjusted to take the elapsed time measurements into consideration. If a specific erasure block has better retention time characteristics, then the correlation function can scale down the effective retention time. Conversely if a particular erasure block has worse retention characteristics the correlation function can scale up the effective retention time. These runtime measurements and dynamic adjustments to the retention time correlation functions allow for a more accurate prediction in the future.

In some arrangements, the stored patterns used for time estimation may include user data that, e.g., includes extra ECC data. In such case, the data pattern is read and verified with the extended ECC field to guarantee correctness. An example of this is described in commonly owned U.S. Publication No. 2013/0006896, the contents of which are hereby incorporated by reference in its entirety. The raw data pattern (e.g., encoded and possibly scrambled data encoded as voltages on the NAND cell) can be read from the media with the standard voltages and compared to the corrected data to create a bit error rate (BER) and voltage shift map. In cases where the stored pattern is a known signature pattern, no ECC verification may be needed, and a BER and voltage shift map may be determined directly based on reading the pattern locations.

Figure 4:
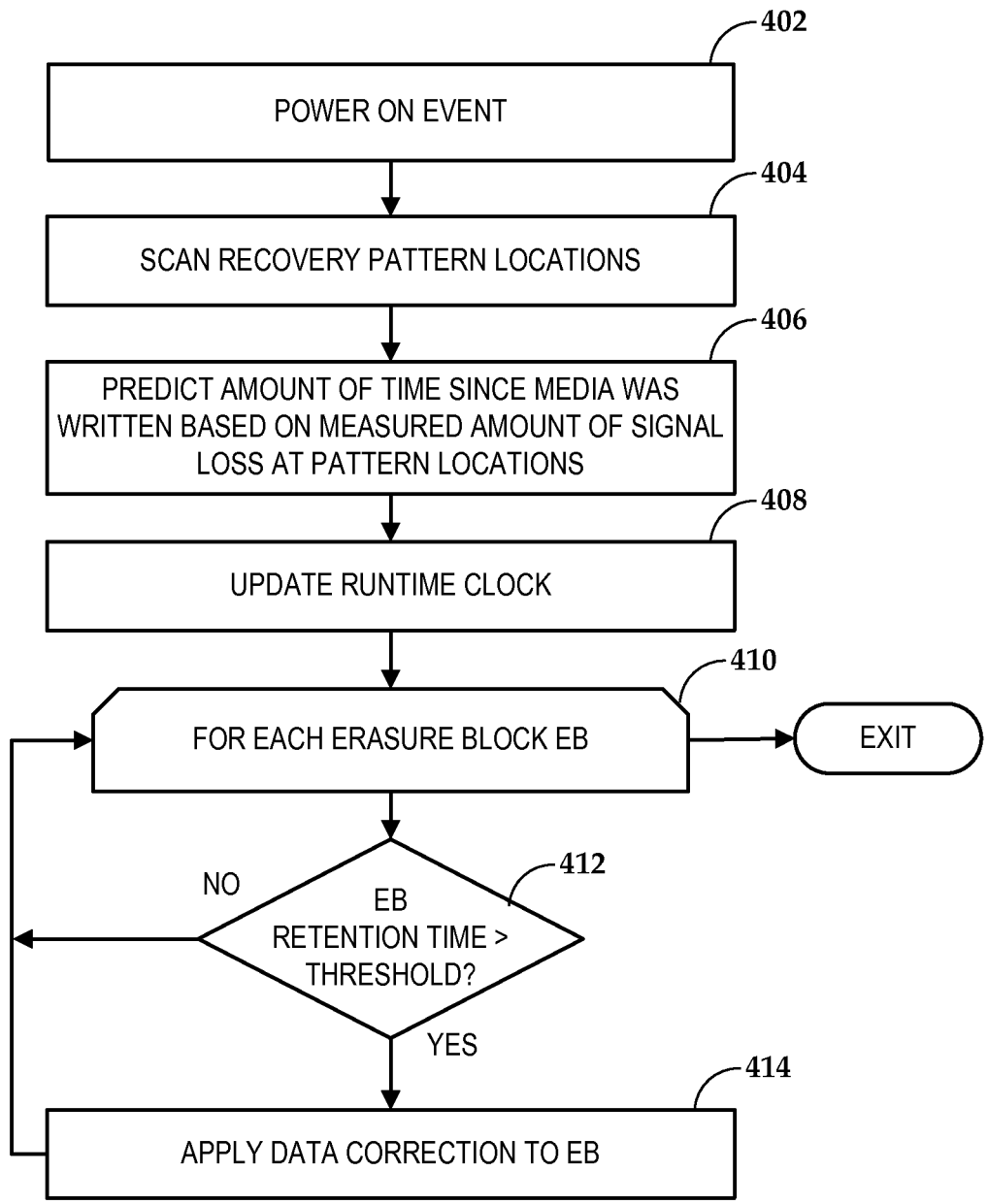
FIG. 4 is a flowchart illustrating the a procedure according to an example embodiment.

In reference now to FIG. 4, a flowchart illustrates an example procedure according to one embodiment. After a power-on event 402 is detected, a storage device can scan 404 the storage media, e.g., to read locations where recovery patterns are stored. The amount of signal loss at these locations is found and used to predict 404 the amount of time since the media has been written. This prediction 406 may utilize, e.g., a correlation function, lookup table, etc., and can take into account the variations of different retention time characteristics of different erasure blocks, word line, etc. Each erasure block may have a different retention time since only a subset of erasure blocks are active at the same time.

The storage device can update 408 the runtime clock to account for power-off time. This may involve selecting some combination of retention time prediction values measured from the media. The selected value may be a conglomerate (e.g., average, weighted or otherwise), smallest, largest, etc. The storage device may also perform a check in each erasure block (EB), as indicated by loop iterator 410. It is determined 412 whether the retention time prediction of the EB (or a configurable set of EBs) has a value above a configurable threshold. If so, the storage device may start applying 414 specific data correction techniques immediately in response to some event, such as power-on, idle time, etc. The data correction may include, for example, a refresh involving garbage collection of the data that is above a configurable threshold of characterization. This may preemptively prevent the host system from experience a catastrophic error upon power-on if performed directly after power on.

In one arrangement, the signature pattern can be read and a BER and voltage shift map can be established for the media. The BER and voltage shift map will establish the direction and magnitude of the degradation of the media. Then a lookup table or translation function may be used to correlate the BER and voltage shift map to establish an estimated retention time for the blocks. Each block may have a different retention time, or a single (e.g., worst case) retention time can be established for the entire device. Once a retention time has been established this value can be fed into garbage collection and background scan processes. This facilitates more accurately determining when the data should be collected as to prevent further degradation of the data. This characterization information can also be fed into the read channel for predictively setting subsequent read voltage levels and confidence levels of the data patterns being read from the media.

Figure 5:
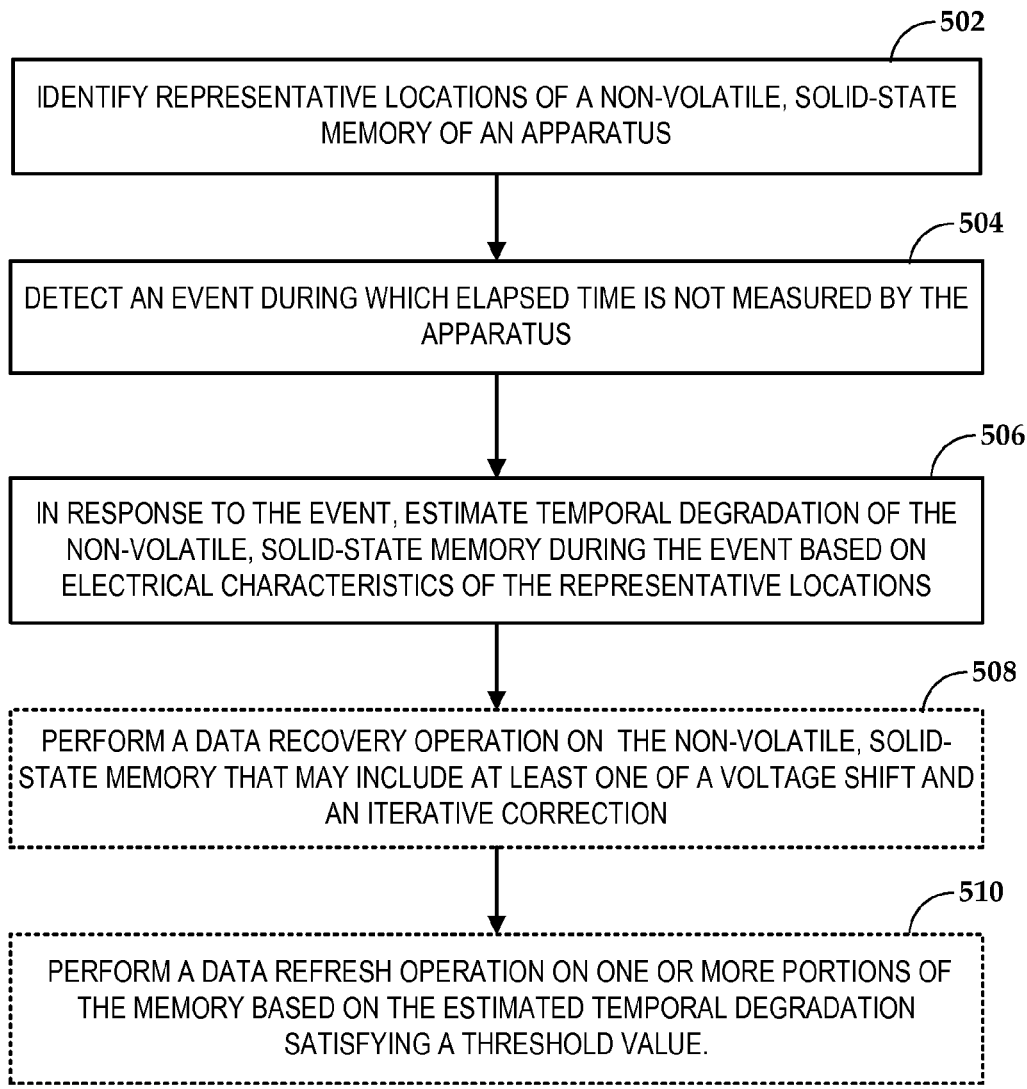
FIG. 5 is a flowchart illustrating a procedure according to another example embodiment.

In reference now to FIG. 5, a flowchart illustrates a procedure according to an example embodiment. Representative locations of a non-volatile, solid-state memory of an apparatus are identified 502. The locations may be randomly chosen, and/or be predetermined locations that exhibit distinct characterization information (e.g., particular memory die, block, word line, etc). An event is detected 504 during which elapsed time is not measured by the apparatus. This event may include power off, standby, suspend, clock error, etc.

In response to the detected event, temporal degradation of the non-volatile, solid-state memory during the event is estimated 506 based on electrical characteristics of the representative locations. The electrical characteristics of the representative locations may include a bit error rate and/or a voltage shift (e.g., symbol threshold voltages shifted relative to nominal/reference voltages). Data stored at the locations may include a known signature pattern and/or user data with an extra amount of error correction code.

The procedure may optionally involve performing 508 a data recovery operation on the non-volatile, solid-state memory. The recovery operation may include at least one of voltage shift and an iterative correction, and the estimated temporal degradation facilitates performing the data recovery operation. The temporal degradations may be determined at block-level, in which case the data recovery operations may be tailored for the blocks based on the block-level temporal degradations. The procedure may also optionally involve performing 510 a data refresh operation on one or more portions (e.g., erasure blocks) of the non-volatile, solid-state memory based on the estimated temporal degradation satisfying a threshold value.

It will be understood that the procedure shown in FIGS. 4 and 5 need not be limited by the precise order and form in which the various operations are presented. The illustrated operations may be performed in parallel, and some operations may be performed more frequently than others. For example, the iteration 410 through the erase blocks may be contingent on other events, e.g., errors detected while scanning 404 pattern locations. Similarly, identification 502 in FIG. 5 of the representative locations may be performed only once (e.g., hardcoded) while the other operations in the flowchart may be performed repeatedly during the life of the apparatus.

The various embodiments described above may be implemented using circuitry and/or software modules that interact to provide particular results. One of skill in the computing arts can readily implement such described functionality, either at a modular level or as a whole, using knowledge generally known in the art. The structures and procedures shown above are only a representative example of embodiments that can be used to manage life of data storage devices as described above.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:
1. A method comprising:
identifying representative locations of a non-volatile, solid-state memory of an apparatus that store characterization data;
detecting an event during which elapsed time is not measured by the apparatus; and in response to the event, estimating temporal degradation of the non-volatile, solid-state memory during the event based on electrical characteristics of the representative locations.

2. The method of claim 1, further comprising performing a data recovery operation on the non-volatile, solid-state memory that includes at least one of a voltage shift and an iterative correction, wherein the estimated temporal degradation facilitates performing the data recovery operation.

3. The method of claim 2, further comprising determining a plurality of temporal degradations each based on the electrical characteristics locations within respective divisions of the non-volatile, solid-state memory, wherein the data recovery operations are tailored for the divisions based on the respective temporal degradations.

4. The method of claim 1, wherein the electrical characteristics of the representative locations comprise at least one of bit error rate and a voltage shift.

5. The method of claim 1, wherein the event comprises a power off event.

6. The method of claim 1, further comprising performing a data refresh operation on one or more portions of the non-volatile, solid-state memory based on the estimated temporal degradation satisfying a threshold value.

7. The method of claim 1, wherein the representative locations are randomly chosen.

8. The method of claim 1, wherein the representative locations are predetermined locations that exhibit distinct characterization information.

9. The method of claim 1, wherein the characterization data stored at the representative locations comprise at least one of:
   a known signature pattern; and
   user data with an extra amount of error correction code.

10. An apparatus comprising:
    a controller capable of being coupled to a non-volatile, solid-state memory, and configured to:
        identify representative locations of the non-volatile, solid-state memory;
        detect an event during which elapsed time is not measured by the apparatus; and
        in response to the event, estimate temporal degradation of the non-volatile, solid-state memory during the event based on electrical characteristics of the representative locations.

11. The apparatus of claim 10, wherein the controller is further configured to perform a data recovery operation on the non-volatile, solid-state memory that includes at least one of voltage shift and an iterative correction, wherein the estimated temporal degradation facilitates performing the data recovery operation.

12. The apparatus of claim 11, wherein the controller is further configured to determine a plurality of temporal degradations each based on the electrical characteristics of locations within respective divisions of the non-volatile, solid-state memory, wherein the data recovery operations are tailored for the divisions based on the respective temporal degradations.

13. The apparatus of claim 10, wherein the electrical characteristics of the representative locations comprise at least one of bit error rate and a voltage shift.

14. The apparatus of claim 10, wherein the event comprises a power off event.

15. The apparatus of claim 10, further comprising performing a data refresh operation on one or more portions of the non-volatile, solid-state memory based on the estimated temporal degradation satisfying a threshold value.

16. The apparatus of claim 10, wherein the representative locations are randomly chosen.

17. The apparatus of claim 10, wherein the representative locations are predetermined locations that exhibit distinct characterization information.

18. The apparatus of claim 10, wherein data stored at the representative locations comprise at least one of:
    a known signature pattern; and
    user data with an extra amount of error correction code.

19. An apparatus comprising:
    a controller capable of being coupled to a non-volatile, solid-state memory, and configured to:
        detect an event during which elapsed time is not measured by the apparatus;
        in response to the event, recover characterization data at representative locations of the non-volatile, solid-state memory to determine electrical characteristics of the representative locations; and
        estimate temporal degradation of the non-volatile, solid-state memory during the event based on the electrical characteristics.

20. The apparatus of claim 19, wherein the characterization data comprise at least one of:
    a known signature pattern; and
    user data with an extra amount of error correction code.

* * * * *